(12) United States Patent
Faue et al.

(10) Patent No.: US 7,039,822 B2
(45) Date of Patent: May 2, 2006

(54) INTEGRATED CIRCUIT MEMORY ARCHITECTURE WITH SELECTIVELY OFFSET DATA AND ADDRESS DELAYS TO MINIMIZE SKEW AND PROVIDE SYNCHRONIZATION OF SIGNALS AT THE INPUT/OUTPUT SECTION

(75) Inventors: Jon Allan Faue, Colorado Springs, CO (US); Harold Brett Meadows, Colorado Springs, CO (US)

(73) Assignee: ProMOS Technologies Inc., Hsinchu (TW)

( * ) Notice: Subject to any disclaimer, the term of this patent is extended or adjusted under 35 U.S.C. 154(b) by 539 days.

(21) Appl. No.: 10/375,575

(22) Filed: Feb. 27, 2003

(65) Prior Publication Data

US 2004/0172569 A1    Sep. 2, 2004

(51) Int. Cl.
*G06F 13/42* (2006.01)
*H04L 7/00* (2006.01)

(52) U.S. Cl. ...................... 713/400; 713/401
(58) Field of Classification Search ............... 713/400, 713/401
See application file for complete search history.

(56) References Cited

U.S. PATENT DOCUMENTS 5,663,921 A * 9/1997 Pascucci et al. ............ 365/233
6,446,249 B1 * 9/2002 Wang et al. .................. 716/17
6,658,523 B1 * 12/2003 Janzen et al. ............... 711/105

* cited by examiner

*Primary Examiner*—A. Elamin
*Assistant Examiner*—Stefan Stoynov
(74) *Attorney, Agent, or Firm*—William J. Kubida; Hogan & Hartson LLP

(57) ABSTRACT

An integrated circuit memory architecture with selectively offset data and address delays to minimize skew and provide synchronization of signals at the input/output section in which the architecture is divided into memory sections, depending upon their distance from the address/control generation block. The address and clock information is re-driven between these sections, which effectively serves to add a quantized number of gate delays in the address path between the sections while concomitantly minimizing skew. A corresponding number of gate delays is also added to the "read" data path for each section such that the number of delays in the address/clock path plus the number of delays in the "read" data path is substantially constant.

28 Claims, 3 Drawing Sheets

INTEGRATED CIRCUIT MEMORY ARCHITECTURE WITH SELECTIVELY OFFSET DATA AND ADDRESS DELAYS TO MINIMIZE SKEW AND PROVIDE SYNCHRONIZATION OF SIGNALS AT THE INPUT/OUTPUT SECTION

BACKGROUND OF THE INVENTION

The present invention relates, in general, to the field of integrated circuit ("IC") devices incorporating memory arrays. More particularly, the present invention relates to an integrated circuit memory architecture with selectively offset data and address delays to minimize skew and provide synchronization of signals at the input/output section.

Many types of DRAM based devices, or integrated circuits including embedded memory arrays, are currently available including extended data out ("EDO"), synchronous DRAM ("SDRAM"), double data rate ("DDR") DRAM and the like. Regardless of configuration, the primary purpose of the DRAM is to store data. Functionally, data may be written to the memory, read from it or periodically refreshed to maintain the integrity of the stored data. In current high density designs, each DRAM memory cell comprises a single pass transistor coupled to an associated capacitor that may be charged to store a value representative of either a logic level "1" or "0". Data stored in these memory cells may be read out and written to them through columns of sense amplifiers coupled to complementary bit lines interconnecting rows of these cells.

Memory architectures are generally designed to incorporate a predetermined number of gate delays in order to get the column information from the address generation portion of the IC to the memory sub-arrays (and/or banks). This delay is uniform for all of the sub-arrays. A certain number of gate delays is also employed to get critical clock and control information from the clock/control generation section to the sub-arrays and to the input/output ("I/O") section of the device. Again, this delay is relatively uniform across the entire architecture. Finally, the "read" data, coming from the memory sub-arrays and directed to the I/O section of the chip also has a certain amount of delay associated with it that is also substantially constant across the entire architecture. In practice, a simple formula can be developed describing the gate counts and delays for the column address, how these integrate with the clock/control information and how the data generated from these addresses and clocks is eventually output at the I/O section, which is substantially identical for every sub-array in the architecture, regardless of its physical location on the chip.

However, with extremely large chips, two extreme cases result. First, memory sub-arrays near the address/control section receive that information most quickly while the "read" data has a long delay before reaching the I/O section. Secondly, sub-arrays more remote from the address/control section receive those signals relatively slowly while the "read" data is only a short delay from the device I/O section.

Given the extremely tight timing requirements for modern memories, minimizing the skew between these two cases is critical for high speed operation. This is especially true for double data rate synchronous dynamic random access memory ("DDR SDRAM") devices wherein all data must be read simultaneously at the I/O section, regardless of from where in the architecture it originated.

SUMMARY OF THE INVENTION

In accordance with the disclosure of the present invention, a memory architecture is disclosed which may be divided into memory sections based upon their distance from the address/control generation block. The address and clock information is re-driven between these sections, which effectively serves to add a quantized number of gate delays in the address path between the sections while concomitantly minimizing skew. A corresponding number of gate delays is also added to the "read" data path for each section such that the number of delays in the address/clock path plus the number of delays in the "read" data path is substantially constant.

In this manner, memory sections of the IC having several gate delays in the address path will have minimal delays in the data path while the converse is also true. The net result is the "read" data is able to arrive at the I/O section of the chip with minimal skew and synchronized with critical clock/control information regardless of where it originated in the architecture. The delays in the address path are purely additive and may be achieved with pairs of simple inverters or non-inverting drivers.

The delays added to the "read" data path are a bit more complex than those employed in the address and clock paths in that, in a preferred embodiment, they implement tri-state control. This tri-state functionality is important, at least in part, because "write" data is also transmitted along these same signal paths. Further, the data bus has to be completely isolated between the various memory sections in order to provide suitably fast signal transitions, especially at the end of the bus nearest the I/O section. That is, if the memory section farthest from the address/control generation block (i.e. slow address/fast data) is driving the "read" data bus, then it is critical that the portion of the data path prior to that section be not connected to it. By effectively removing prior memory sections from being coupled to the data bus, the capacitance for that portion need not be driven and the data delays per section are then nominally equal with the address delays per section.

Particularly disclosed herein is an integrated circuit device incorporating a plurality of memory arrays located intermediate an address generation block and a data output block. The device comprises an address bus extending from the address generation block to each of the memory arrays for accessing selected data therein. A data bus extends from each of the memory arrays to the data output block for providing the selected data thereto. Signal delay elements are selectively interposed on the address and data buses between preselected ones of the memory arrays such that a cumulative number of signal delays on both the address and data buses from the address generation block to the data output block is substantially a constant for each of the memory arrays.

Also disclosed herein is a method for minimizing skew between address, clock and data signals on respective address, clock and data buses extending between an address/clock generation block and a data output block in an integrated circuit memory device. The method comprises selectively placing a first predetermined number of signal delays on the address and clock buses between the address/clock generation block and each of preselected ones of memory arrays of the memory device coupled to the data bus. A second predetermined number of signal delays are selectively placed on the data bus between each of the preselected ones of the memory arrays such that a total of the first and second predetermined number of the signal delays on the address, clock and data buses from the address/clock generation block to the data output block is substantially a constant for each of the memory arrays.

Further disclosed herein is an integrated circuit device comprising N memory arrays, an address bus coupling an address generation block to each of the memory arrays, a data bus coupling each of the memory arrays to a data output block, a signal delay interposed on the address bus between the address generation block and each of the memory arrays and a signal delay interposed on the data bus between each of the memory arrays such that each of the memory arrays present a cumulative delay to address and data signals on the address and data buses between the address generation and data output blocks of substantially N signal delays.

Also further disclosed herein is a technique for minimizing skew between clock and data signals at a data output block of an integrated circuit memory device comprising a plurality of memory arrays. The technique comprises selectively adding delays to address and clock information buses coupled to the memory arrays such that a cumulative delay to signals generated on the address and clock information buses increases as a position of each of the memory arrays becomes more distal from an address/clock generation block and selectively adding delays to a data bus coupled to the memory arrays such that a cumulative delay to signals output on the data bus decreases as a position of each of the memory arrays becomes more proximate to the data output block such that a total delay added to the address, clock information and data buses for each of the memory arrays is substantially constant.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
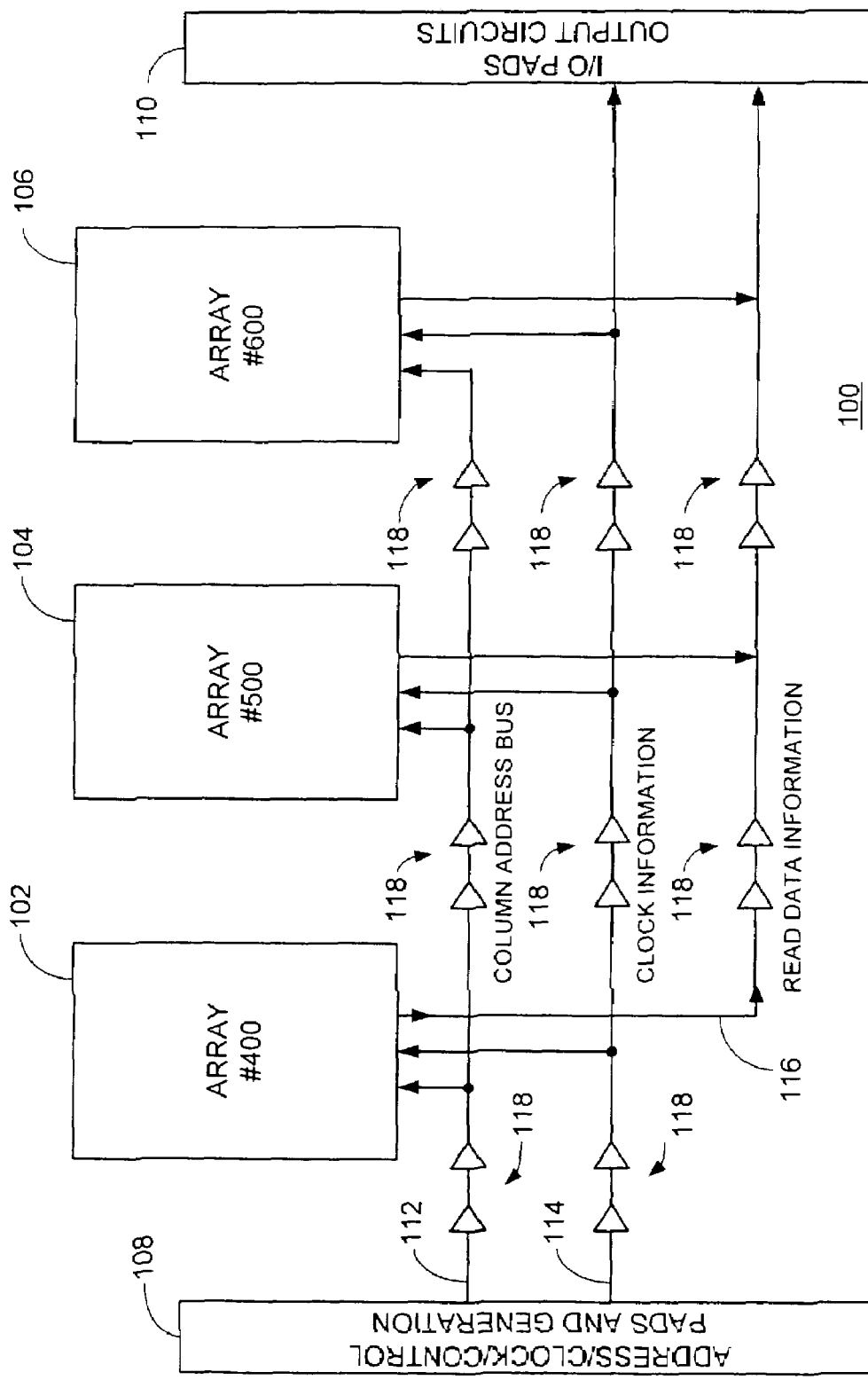
FIG. 1 is a simplified functional block diagram of a representative embodiment of an integrated circuit memory device architecture incorporating offset data and address delays in accordance with the present invention.

With reference now to FIG. 1, a simplified functional block diagram of a representative embodiment of an integrated circuit memory device 100 architecture is shown incorporating offset data and address delays in accordance with the present invention. A number of memory arrays 102, 104 and 106 comprising, for example, SDRAM are illustrated as Array #400, Array #500 and Array #600 respectively.

An address/clock/control pads and generation block 108 provides column address information on a column address bus 112 and clock information on a clock address bus 114 to the various memory arrays 102, 104 and 106 as well as to the memory device 100 input/output ("I/O") pads and output circuit block 110. Each of the memory arrays 102, 104 and 106 provides data read out of the memory cells to a read data information bus 116 which is also supplied to the I/O pads and output circuit block 110. In accordance with the present invention, a first group of driver pairs 118 are interposed on the column address bus 112 and clock information bus 114 between the address/clock/control pads and generation block 108 and the memory array 102. Similarly, another group of driver pairs 118 are interposed on the column address bus 112, clock information bus 114 and read data information bus 116 between the memory array 102 and memory array 104 as well as between the memory array 104 and the memory array 106.

For proper memory device 100 operation, the address information must remain synchronized to the clock information as it moves across the chip. At each local array, "read" data is generated from the address/clock information. This "read" data must stay synchronized to the clock information at the output circuit. Therefore, offsetting the address delays with the data delays at each segment point serves to make the total additive delay for address and data constant and ensures that the final data will arrive at the output circuit synchronized with the clock information.

The architecture of the memory device 100 of the present invention efficiently drives the column addresses across even relatively large integrated circuit dies by effectively segmenting the chip into memory sections and re-driving the address bus as it crosses into the next section. Utilizing one large bus for the entire chip would prove to be too slow and, more importantly, the edge rates (dv/dt) of address changes would be too slow and imprecise to provide accurate timing for high speed operation. Since different segments of the memory device 100 have different gate counts from the clock, (due to the re-drive provided by the driver pairs 118) the data is synchronized back to the address path in order to offset the data path delays from the address path. The total number of address and data delays for a given bit is substantially the same.

In the embodiment illustrated, memory array 102 (or chip section #400) has two address/clock delays and four data delays; memory array 104 (or chip section #500) has four address/clock delays and two data delays and memory array 106 (or chip section #600) has six address/clock delays and no data delays. Thus each memory array (or chip section) has a total of six delays.

Figure 2:
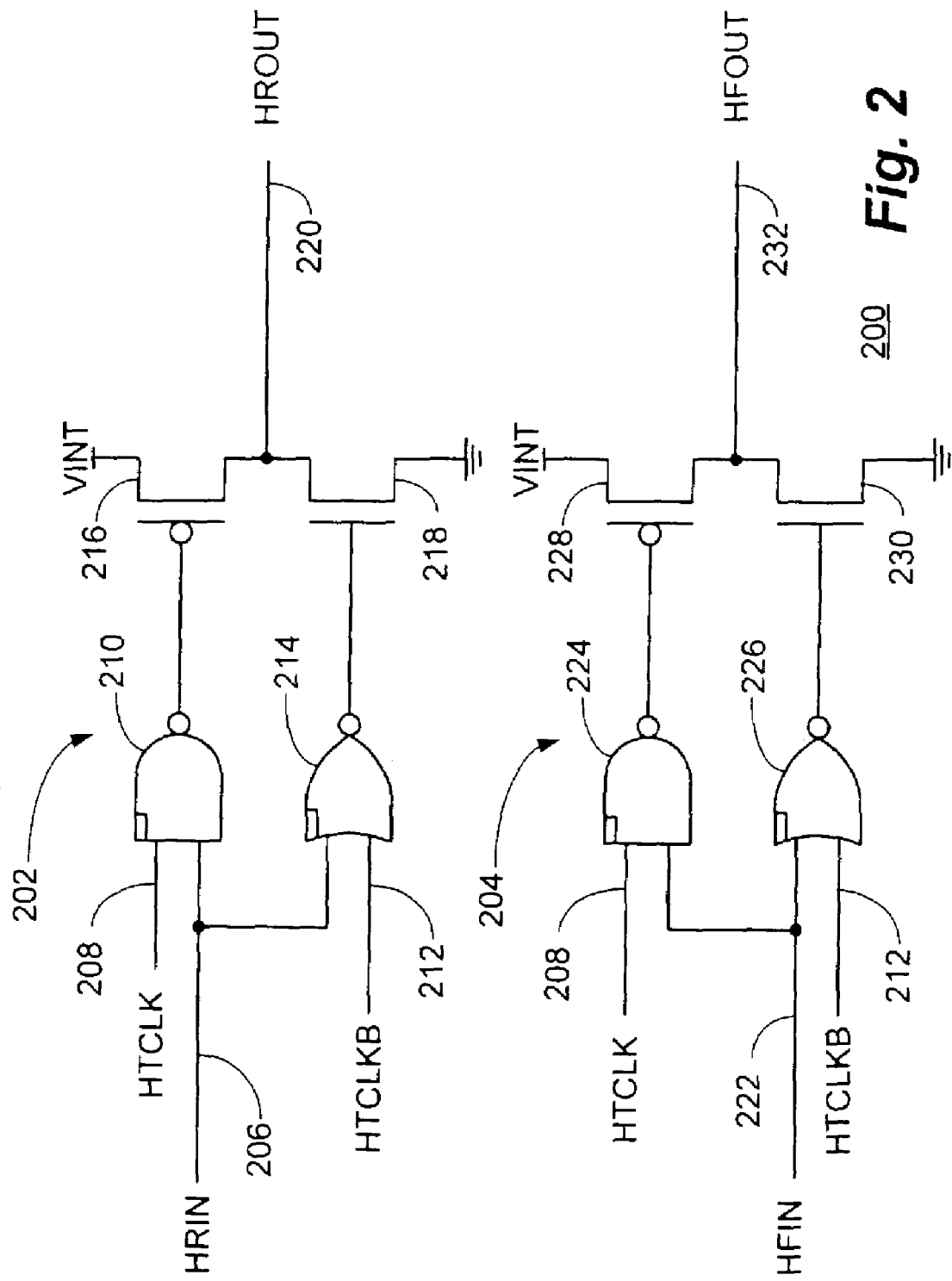
FIG. 2 is a schematic diagram of a pair of tri-state drivers for possible use in conjunction with the production of the offset data and address delays indicated in the preceding figure for both rising and falling read data in a double data rate ("DDR") synchronous dynamic random access memory ("SDRAM") device implementation.

With reference additionally now to FIG. 2, a schematic diagram of a pair of tri-state drivers 200 is shown for possible use in conjunction with the production of the offset data and address delays indicated in the preceding figure for both rising and falling read data in a double data rate ("DDR") synchronous dynamic random access memory ("SDRAM") device implementation.

For data read out on the rising edge of the memory device clock signal, a first tri-sate driver 202 is illustrated receiving an input signal on HRIN line 206. HRIN line 206 is provided as one input to a two input NAND gate 210 and to one input of a two input NOR gate 214. The other input of the NAND gate 210 receives a clock signal input on HTCLK line 208 while the other input of the NOR gate 214 receives a complementary clock signal on HTCLKB line 212. Output of the NAND gate 210 is coupled to the gate terminal of a P-channel MOS transistor 216 which is connected in series with an N-channel MOS transistor 218 between an internal supply voltage ("VINT") and circuit ground (or "VSS"). The output of the NOR gate 214 is coupled to the gate terminal of transistor 218 and an output of the tri-state driver 202 is taken at the node intermediate the transistors 216 and 218 on HROUT line 220.

In like manner, for data read out on the falling edge of the memory device clock signal, a second tri-state driver 204 is illustrated receiving an input signal on HFIN line 222. HFIN line 222 is provided as one input to a two input NAND gate 224 and to one input of a two input NOR gate 226. The other input of the NAND gate 224 receives the clock signal input on HTCLK line 208 while the other input of the NOR gate 226 receives the complementary clock signal on HTCLKB line 212. Output of the NAND gate 224 is similarly coupled to the gate terminal of a P-channel MOS transistor 228 which is connected in series with an N-channel MOS transistor 230 between VINT and circuit ground. The output of the NOR gate 226 is coupled to the gate terminal of transistor 230 and an output of the tri-state driver 204 is taken at the node intermediate the transistors 228 and 230 on HFOUT line 232.

By way of example, and with reference to the tri-state driver 202 in particular, when the signal on HRIN line 206 is at a logic "high" level and the signal on HTCLK line 208 is at a logic "low" level (the signal on the complementary HTCLKB line 212 will then be at a logic "high" level) the output of the NAND gate 210 will be at a logic "high" level and the output of the NOR gate 214 will be at a logic "low" level. This will cause transistors 216 and 218 to both be "off" causing HROUT line 220 to be in a tri-state condition.

When the signal on HRIN line 206 is at a logic "low" level and the signal on HTCLK line 208 is at a logic "high" level (the signal on the complementary HTCLKB line 212 will then be at a logic "low" level) the output of the NAND gate 210 will be at a logic "high" level and the output of the NOR gate 214 will also be at a logic "high" level. In this situation, transistor 216 is turned "off" and transistor 218 is "on", thereby pulling the HROUT line 220 toward a logic "low" level approaching circuit ground.

Conversely, when the signal on HRIN line 206 is at a logic "high" level and the signal on HTCLK line 208 is also at a logic "high" level (the signal on the complementary HTCLKB line 212 will then be at a logic "low" level) the output of the NAND gate 210 will be at a logic "low" level and the output of the NOR gate 214 will also be at a logic "low" level. In this situation, transistor 216 is turned "on" and transistor 218 is "off", thereby pulling the HROUT line 220 toward a logic "high" level approaching the level of VINT.

The tri-state driver 204 will function in a similar manner with respect to the respective states of the signals on HFIN line 222 and HTCLK line 208 and complementary HTCLKB line 212.

Figure 3:
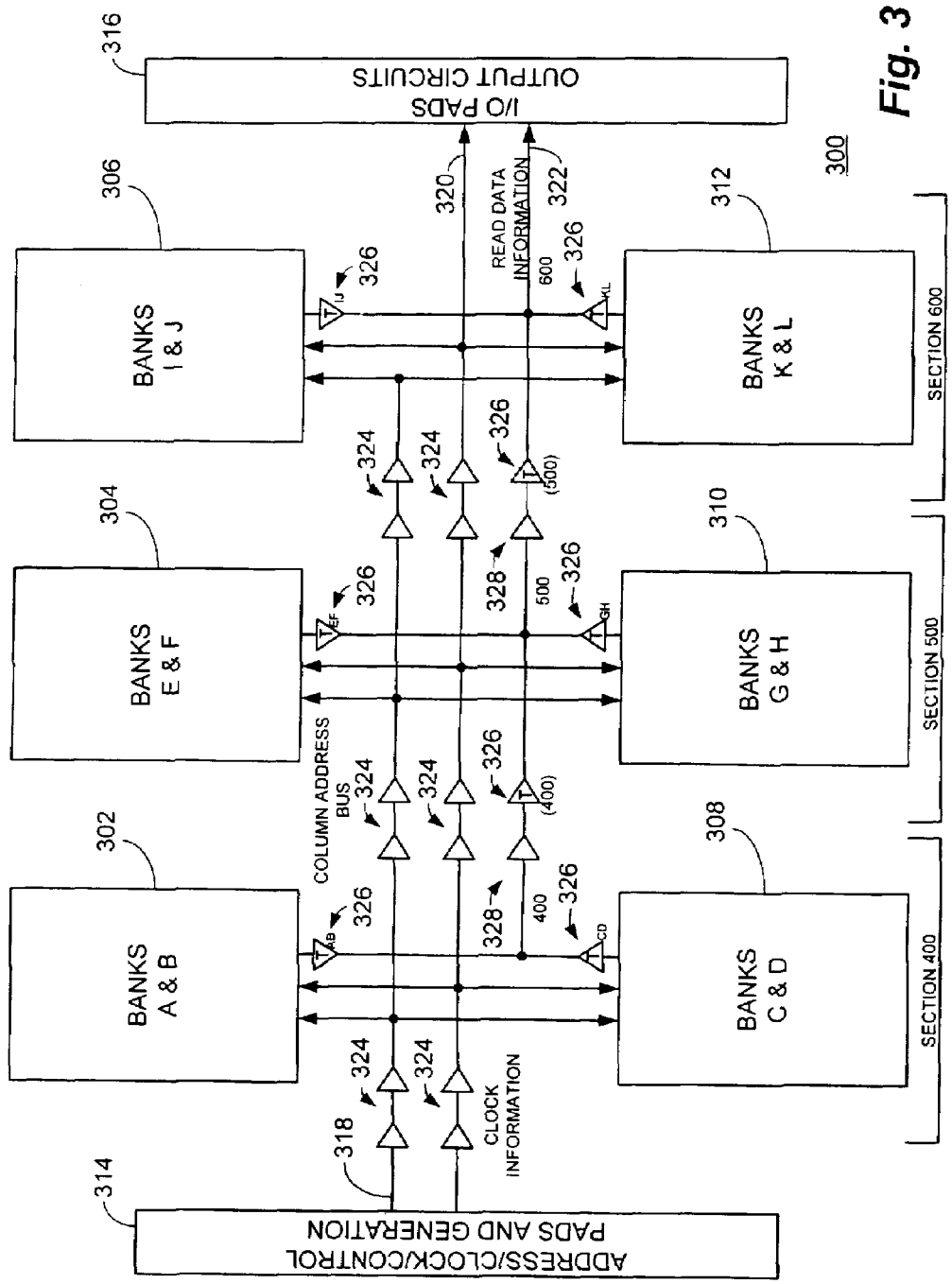
FIG. 3 is simplified functional block diagram of another particular exemplary implementation of an integrated circuit memory device architecture incorporating offset data and address delays utilizing, for example, the tri-state drivers of the preceding figure.

With reference additionally now to FIG. 3, simplified functional block diagram of another particular exemplary implementation of an integrated circuit memory device 300 architecture is shown incorporating offset data and address delays and utilizing, for example, the tri-state drivers 200 of the preceding figure. A number of memory sections 302, 304, 306, 308, 310 and 312 are illustrated as Bank A&B, Bank E&F, Bank I&J, Bank C&D, Bank G&H and Bank K&L respectively.

An address/clock/control pads and generation block 314 provides column address information on a column address bus 318 and clock information on a clock address bus 320 to the various memory banks 302 through 312 as well as to the memory device 300 I/O pads and output circuit block 316. Each of the memory sections 302 through 312 provides data read out of the memory cells to a read data information bus 322 which is also supplied to the I/O pads and output circuit block 316.

In accordance with the present invention, a first group of driver pairs 324 are interposed on the column address bus 318 and clock information bus 320 between the address/clock/control pads and generation block 314 and the memory sections 302 and 308. Similarly, another group of driver pairs 324 are interposed on the column address bus 318 and clock information bus 320 between the memory sections 302, 308 and the memory sections 304, 310 as well as between the memory sections 304, 310 and the memory sections 306, 312. Individual tri-state drivers 326 couple the memory sections 302 through 312 to the read data information bus 322 as shown. A single driver 328 in series with another tri-state driver 326 couples the memory sections 302, 306 to the memory sections 304, 310 and, in turn another single driver 328 in series with another tri-state driver 326 couples the memory sections 304, 310 to the memory sections 306, 312.

As an example, if Bank E in section 304 is being read, then the driver $T_{EF}$ 326 is enabled to drive the "read" data onto the data bus 322. The preceding driver $T_{400}$ 326 is disabled so the load from the bus at that point is not driven. Driver $T_{GH}$ would also be "off" in order to avoid contention. Driver $T_{500}$ re-drives the data from the data bus onto the section 600 portion. Drivers from banks in section 600 (I&J and K&L) are also "off" (tri-stated) in order to avoid contention.

In general operation, only the bank (or group of banks) actually being addressed drive data onto the data bus 322 at that section. All other drivers 326 from un-addressed banks in that section remain in a tri-state condition. The driver 326 from a bus coming from a prior section, (being closer to the address/clock control pads and generation block 314) also remains tri-stated. The driver 326 from the data bus to the next section (being closer to the I/O pads and output circuit block 316) is activated together with the drivers 326 on the data bus 322 associated with any subsequent sections while all drivers 326 from banks in the next section, and any subsequent sections are "off" (or tri-stated).

While there have been described above the principles of the present invention in conjunction with specific memory device layout and circuitry, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device incorporating a plurality of memory arrays located intermediate an address generation block and a data output block, said device comprising:
    an address bus extending from said address generation block to each of said plurality of memory arrays for accessing selected data therein;
    a data bus extending from each of said plurality of memory arrays to said data output block for providing said selected data thereto; and
    signal delay elements selectively interposed on said address and data buses between preselected ones of said plurality of memory arrays such that a cumulative number of signal delays on both said address and data buses from said address generation block to said data output block is substantially a constant for each of said plurality of memory arrays.

2. The integrated circuit device of claim 1 further comprising:
    a clock generation block in association with said address generation block;
    a clock bus extending between said clock generation block and said data output block; and
    additional signal delay elements selectively interposed on said clock bus between preselected ones of said plurality of memory arrays such that a cumulative number of signal delays on said clock bus equals said constant.

3. The integrated circuit device of claim 1 wherein said signal delay elements comprise inverter pairs.

4. The integrated circuit device of claim 3 wherein said inverter pairs comprise CMOS inverters.

5. The integrated circuit device of claim 1 wherein said signal delay elements comprise non-inverting drivers.

6. The integrated circuit device of claim 1 further comprising a tri-state driver interposed between each of said plurality of memory arrays and said data bus.

7. The integrated circuit device of claim 1 wherein at least one of said signal delay elements interposed between preselected ones of said plurality of memory arrays on said data bus comprises a tri-state driver.

8. The integrated circuit device of claim 1 wherein at least a portion of said plurality of memory arrays are each arranged into a pair of banks laterally opposite each other from said address and data buses.

9. The integrated circuit device of claim 1 wherein said plurality of memory arrays comprise dynamic random access memory.

10. The integrated circuit device of claim 9 wherein said plurality of memory arrays comprise synchronous dynamic random access memory.

11. A method for minimizing skew between address, clock and data signals on respective address, clock and data buses extending between an address/clock generation block and a data output block in an integrated circuit memory device, said method comprising:
    selectively placing a first predetermined number of signal delays on said address and clock buses between said address/clock generation block and each of preselected ones of memory arrays of said memory device coupled to said data bus; and
    selectively placing a second predetermined number of signal delays on said data bus between each of said preselected ones of said memory arrays such that a total of said first and second predetermined number of signal delays on said address, clock and data buses from said address/clock generation block to said data output block is substantially a constant for each of said preselected ones of said memory arrays.

12. The method of claim 11 wherein said steps of selectively placing said first and second predetermined number of signal delays are carried out by series coupled signal inverter pairs.

13. The method of claim 11 wherein said steps of selectively placing said first and second predetermined number of signal delays are carried out by non-inverting drivers.

14. The method of claim 11 wherein said step of selectively placing said second predetermined number of signal delays is carried out by:
    providing a tri-state driver for each of said second predetermined number of signal delays.

15. The method of claim 11 further comprising:
    providing a tri-state driver for coupling each of said preselected ones of said memory arrays to said data bus.

16. The method of claim 11 wherein said first predetermined number of signal delays is one more than said second predetermined number of signal delays.

17. The method of claim 11 further comprising:
    partitioning each of said preselected ones of said memory arrays into a plurality of memory banks; and
    placing each of said plurality of memory banks on laterally opposite sides of said data bus.

18. An integrated circuit device comprising:
    N memory arrays;
    an address bus coupling an address generation block to each of said N memory arrays;
    a data bus coupling each of said N memory arrays to a data output block;
    a signal delay interposed on said address bus between said address generation block and each of said N memory arrays; and
    a signal delay interposed on said data bus between each of said N memory arrays such that each of said N memory arrays present a cumulative delay to address and data signals on said address and data buses between said address generation and data output blocks of substantially N signal delays.

19. The integrated circuit device of claim 18 further comprising:
    a clock generation block in association with said address generation block;
    a clock bus extending between said clock generation block and said data output block;
    a signal delay interposed on said clock bus between said clock generation block and each of said N memory arrays.

20. The integrated circuit device of claim 18 wherein said signal delays comprise inverter pairs.

21. The integrated circuit device of claim 20 wherein said inverter pairs comprise CMOS inverters.

22. The integrated circuit device of claim 18 wherein said signal delays comprise non-inverting drivers.

23. The integrated circuit device of claim 18 further comprising:
    a tri-state driver interposed between each of said N memory arrays and said data bus.

24. The integrated circuit device of claim 18 wherein at least one of said signal delays interposed between each of said N memory arrays on said data bus comprise a tri-state driver.

25. The integrated circuit device of claim 18 wherein at least a portion of said N memory arrays are each arranged into a pair of banks laterally opposite each other from said data bus.

26. The integrated circuit device of claim 18 wherein said N memory arrays comprise dynamic random access memory.

27. The integrated circuit device of claim 26 wherein said N memory arrays comprise synchronous random access memory.

28. A technique for minimizing skew between clock and data signals at a data output block of an integrated circuit memory device comprising a plurality of memory arrays, said technique comprising:

selectively adding delays to address and clock information buses coupled to said plurality of memory arrays such that a cumulative delay to signals generated on said address and clock information buses increases as a position of each of said plurality of memory arrays becomes more distal from an address/clock generation block; and selectively adding delays to a data bus coupled to said plurality of memory arrays such that a cumulative delay to signals output on said data bus decreases as a position of each of said plurality of memory arrays becomes more proximate to said data output block such that a total delay added to said address, clock information and data buses for each of said plurality of memory arrays is substantially constant.

* * * * *